(12) United States Patent
Ono et al.

(10) Patent No.: US 6,710,734 B2
(45) Date of Patent: Mar. 23, 2004

(54) PARALLEL AD CONVERTER

(75) Inventors: Koichi Ono, Kanagawa (JP); Hirotaka Shimizu, Kanagawa (JP); Masashi Takeda, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/345,282

(22) Filed: Jan. 16, 2003

(65) Prior Publication Data

US 2003/0169196 A1 Sep. 11, 2003

(30) Foreign Application Priority Data

Jan. 18, 2002 (JP) .................................... P2002-009515

(51) Int. Cl.[7] .............................................. H03M 1/36
(52) U.S. Cl. .................... 341/159; 341/155; 327/65; 327/563
(58) Field of Search ........................ 341/155, 156, 341/158, 159; 327/52, 65, 307, 363

(56) References Cited

U.S. PATENT DOCUMENTS 4,797,631 A * 1/1989 Hsu et al. .................. 330/253
5,291,198 A * 3/1994 Dingwall et al. ........... 341/159
5,589,785 A * 12/1996 Garavan ....................... 327/63
6,081,140 A * 6/2000 King ............................ 327/77
2003/0095431 A1 * 5/2003 Khalid .................... 365/185.03

OTHER PUBLICATIONS

K. Nagaraj et al, , "A Dual–Mode 700–Msamples/s 6–bit 200–Msamples/s 7–bit A/D Converter in a 0.25–$\mu$m Digital CMOS Process", EEE Journal of Solid State Circuit, vol. 35, No. 12, Dec. 2000, pp 1760–1768.

* cited by examiner

*Primary Examiner*—Howard L. Williams
(74) *Attorney, Agent, or Firm*—Rader, Fishman & Grauer PLLC; Ronald P. Kananen

(57) ABSTRACT

An interpolation parallel AD converter is provided in which a switch is installed at each pre-amplifier in a first pre-amplifier array for selectively short-circuiting a portion between a comparison input end and a reference input end thereof, while a load transistor, a switch for selectively diode-connecting the load transistor, and a capacitor for keeping a voltage when the load transistor is diode-connected are installed in a pre-amplifier in a second pre-amplifier array. An offset occurring in each pre-amplifier in the first pre-amplifier array is suppressed by a compression effect of using a gain difference between a reset mode and an amplification mode.

14 Claims, 7 Drawing Sheets

PARALLEL AD CONVERTER

CROSS REFERENCES TO RELATED APPLICATIONS

The present document is based on Japanese Priority Document JP 2002-009515, filed in the Japanese Patent Office on Jan. 18, 2002, the entire contents of which are incorporated herein by reference.

BACKGROUND OF THE INVENTION

1. Field of the Invention

The present invention relates to a parallel AD converter and, more particularly, to a parallel interpolation AD converter in which an usage of an interpolation technique avoids an increase in circuit size and also enables high-speed operation at low electric power consumption.

2. Description of Related Art

FIG. 8 shows a basic configuration of the parallel AD converter. This parallel AD converter is basically provided with a sample/hold (S/H) circuit 101, a reference voltage generation circuit 102, a comparator array 103 and an encoding circuit 104. The sample/hold circuit 101 samples an input analog signal and holds its sampled value for a certain period. The reference voltage generation circuit 102 is configured such that resistors R are connected in series, and it generates a plurality of reference voltages, in which voltage values are different, at respective connection nodes of the resistors R.

The comparator array 103 is configured such that comparators whose number corresponds to their resolution capability are arranged in the array, and it compares a hold voltage of the sample/hold circuit 101 with the plurality of reference voltages generated by the reference voltage generation circuit 102 all at once. At this time, among the respective comparators of the comparator array 103, when the closest reference voltage to the hold voltage is defined as the boundary voltage, all the comparators whose reference voltages are equal to or higher than the hold voltage output a logic "0" level, and all the comparators whose reference voltages are lower than the hold voltage output a logic "1" level.

By the way, although not shown; a logic processor circuit is usually installed at a later stage of the comparator array 103. This, logic processor circuit carries out a logic process for carrying out an exclusive-OR between the outputs of the comparators adjacent to each other, in the comparator array 103. The encoding circuit 104 encodes the result of the logic process in the logic processor circuit, and digitally converts it, and obtains a digital signal.

Here, in each comparator in the comparator array 103, a sufficient gain can not be usually obtained from an amplifying stage composed of a single stage. Thus, as shown in FIG. 8, an amplifying stage composed of about two stages is installed, and, in many cases a latch circuit is installed at a final stage. Hence, for example, in a case of six bits, 63 pieces of first pre-amplifiers, 63 pieces of second pre-amplifiers and 63 pieces of latching circuits are respectively required.

In the case of the above-mentioned basic parallel AD converter, it is constituted by the comparators corresponding to the resolution capability of the comparator array 103. Thus, as the resolution capability is improved, the circuit size is exponentially expanded. In association with this expansion, the electric power consumption is increased, and the chip size is also enlarged.

On the contrary, a parallel interpolation AD converter in which an usage of an interpolation technique protects an expansion in a circuit size and also enables a high-speed operation at low electric power consumption is reported in the following document:
Document: [A Dual-Mode 700 Msps 6 bit 200 Msps 7 bit ADC in a 0.25 μm Digital CMOS] (IEEE Journal of Solid-State Circuits, Vol.35, No.12. December 2000).

FIG. 9 shows the configuration of the parallel interpolation AD converter. This parallel interpolation AD converter is provided with a sample/hold circuit 111, a reference voltage generation circuit 112, a first preamplifier array 113, a second pre-amplifier array 114, a latching circuit array 115 and an encoding circuit 116. The basic operation for AD conversion is similar to the case of the above-mentioned basic parallel AD converter.

However, in this parallel interpolation AD converter, the number of the pre-amplifiers in the first preamplifier array 113 is reduced to one-half thereof, and on the other hand, the second pre-amplifier array 114 generates an interpolation signal from the outputs of two pre-amplifiers adjacent to each other in the first preamplifier array 113 and obtains the comparator output corresponding to the resolution capability. In this way, the second-pre-amplifier array 114 generates a reduced comparator output through the interpolation. Thus, the number of the pre-amplifiers in the first pre-amplifier array 113 can be reduced to one-half thereof. Hence, this is the approach that is effective for the miniaturization of circuit size and the reduction in electric power consumption.

However, the parallel interpolation AD-converter according to the-above-mentioned conventional example has the following problem in the circuit implement. That is, if the first pre-amplifier array 113 uses a transistor of a small size in designing a circuit, the property of the transistor is liable to be varied. In association with the variation, an offset is brought about. Thus, in order to cancel this offset, a chopper-type amplifier is used as each pre-amplifier.

As mentioned above, if the chopper-type amplifier is used as each pre-amplifier in the first pre-amplifier array 113, a capacitor C to detect a difference between a reference voltage and a hold voltage of the sample/hold circuit 111 interposes between an output end of the sample/hold circuit 111 and an input end of each preamplifier. This results in a tendency to increase the input capacitance of the first pre-amplifier array 113, although the number of the amplifiers in the first pre-amplifier array 113 is halved.

This input capacitance becomes a heavy load on the sample/hold circuit 111. For this reason, the sample/hold circuit 111 requires a circuit configuration containing an output stage having a sufficient driving performance. The configuration in which the output stage has a sufficient driving performance implies that the electric power consumption in the sample/hold circuit 111 is large. Thus, irrespective of the parallel interpolation AD converter that is expected to be the approach that is effective for the reduction in the electric power consumption, there is brought about the increase in the electric power consumption of the entire complementary parallel-type AD converter, consequently.

The present invention is proposed in view of the above-mentioned problems. Accordingly, there is a need to provide a parallel AD converter which enables an assured reduction in electric power consumption and also enables a faster circuit operation.

SUMMARY OF THE INVENTION

In order to solve the above-mentioned subject, the present invention provides a parallel interpolation AD converter, which comprises a reference voltage generator, a first amplifier array and a second amplifier array. The voltage generator generates a plurality of reference voltages. The first amplifier array is constituted by arranging first differential amplifier circuits, in which an analog signal is inputted to a comparison input end of each of the first differential amplifiers, and a corresponding reference voltage among the plurality of reference voltages is inputted to a reference input end of each of the first differential amplifier circuits, respectively, and each of the first-differential amplifier circuits amplifies a potential difference between both input ends. The second amplifier array comprises interpolation amplifier circuits, each of which interpolates and amplifies a portion between output voltages from the first differential amplifier circuits adjacent to each other in this first amplifier array, and second differential amplifiers, each of which amplifies the output voltage from every other first differential amplifier in the first amplifier array. The interpolation amplifier circuits and the second differential amplifier circuits are alternately arranged. In the AD converter, the first differential amplifier circuit has a reset switch that is controlled so as to be opened or closed by a control clock of a predetermined cycle between the comparison input end and the reference input end. Each of the interpolation amplifier and the second differential amplifier circuit includes: a load transistor, a switching unit for selectively diode-connecting the load transistor in synchronization with the control clock; and a capacitor for keeping a voltage of the load transistor when the load transistor is diode-connected.

In the parallel interpolation AD converter having the above-mentioned configuration, each first differential amplifier in the first amplifier array has a reset mode-and an amplification mode. The comparison input end and the reference input end are short-circuited by the switch that is turned on (closed) at a time of the reset mode. Each first differential amplifier circuit, when proceeding to the amplification mode, amplifies the potential difference between the comparison input end and the reference input end and outputs it as a differential voltage. In each of the interpolation amplifier circuit and the second differential amplifier circuit in the second amplifier array, the load transistor is diode-connected (at a diode load) by the switching unit that is turned on at a time of the reset mode. Then, a voltage (corresponding to an offset) at the time of this diode load is accumulated in the capacitor. At a time of the amplification mode, the switching unit is turned off, and the load transistor is set at the original connection state. In accordance with the connection state of the load transistor switched by this switching unit, the gain of the amplifier is changed between the reset mode and the amplification mode. Thus, the offset occurring in the first differential amplifier circuit is suppressed by the compression effect of using this gain difference.

DESCRIPTION OF THE PREFERRED EMBODIMENT

An embodiment of the present invention will be described below in detail with reference to the drawings.

Figure 1:
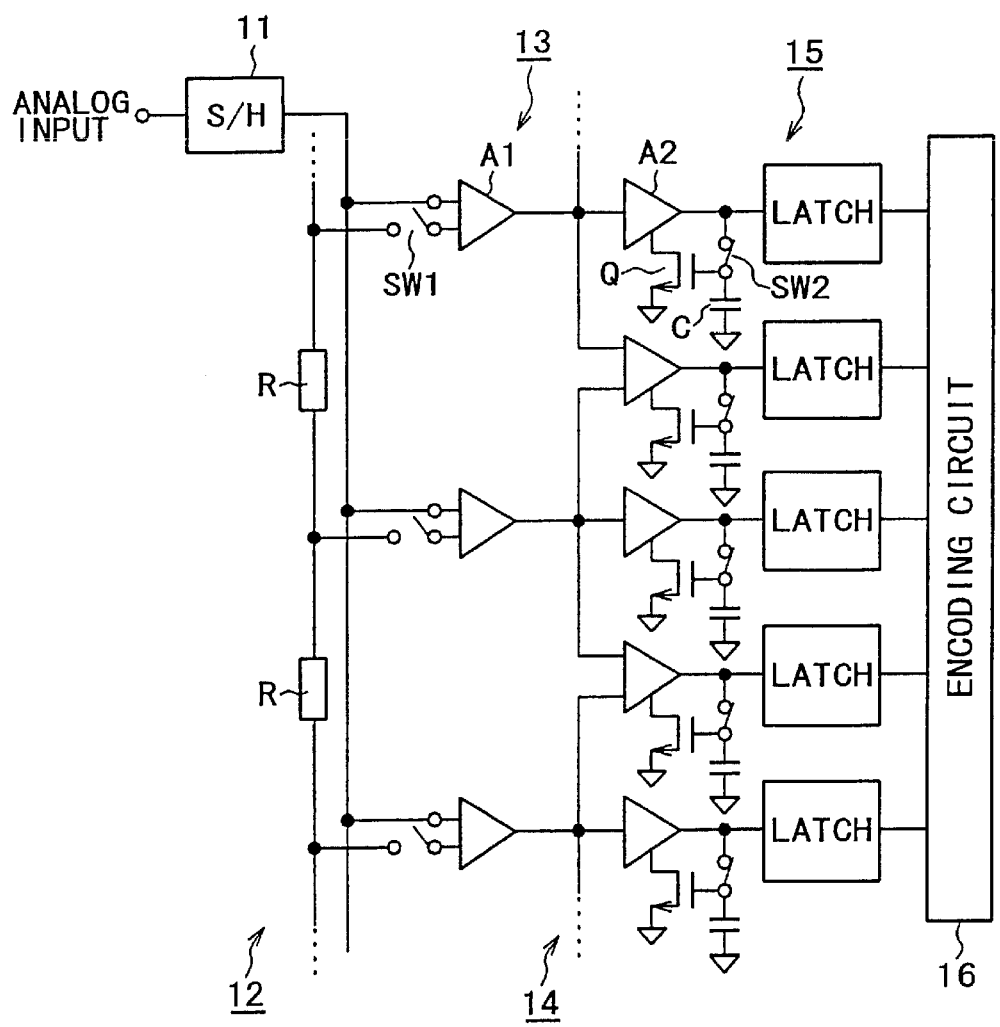
FIG. 1 is a circuit block diagram showing a configuration of a parallel interpolation AD converter according to an embodiment of the present invention.

FIG. 1 is a circuit block diagram showing a configuration of a parallel AD converter according to an embodiment of the present invention, and it exemplifies a case of an application to a parallel interpolation AD converter using an interpolation technique. As can be seen from FIG. 1, the parallel interpolation AD converter according to this embodiment is provided with a sample/hold (S/H) circuit 11, a reference voltage generation circuit 12, a first pre-amplifier array 13 serving as a first amplifier array, a second pre-amplifier array 14 serving as a second amplifier array, a latch circuit array 15 and an encoding circuit 16. The feature of the present invention lies, in the-actual configuration composed of the first pre-amplifier array 13 and the second pre-amplifier array, 14.

In the parallel interpolation AD converter having the above-mentioned configuration, the sample holding circuit 11 samples an input analog signal and holds its sampled value for a certain period. The reference voltage generating circuit 12 is configured such that a plurality of resistors R are connected in series, and it generates a plurality of reference voltages, in which voltage values are different from each other, at respective connection nodes of the resistors R.

The first pre-amplifier array 13 is composed of preamplifiers A1 whose number is equal to one-half the number corresponding to the resolution capability and a hold voltage of the sample/hold circuit 11 is inputted to a comparison input end, and a corresponding-reference voltage among the plurality of reference voltages generated at the respective connection nodes of the reference voltage generation circuit 12 is inputted to a reference input end. As the pre-amplifier A1, a non-chopper-type amplifier is used. Also, the portion between the comparison input end of the pre-amplifier A1 and the reference input end is configured such that it can be selectively short-circuited by a switch SW1, which will be described later in detail.

The second pre-amplifier array 14 is configured such that pre-amplifiers A2 whose number corresponds to the resolution capability are arranged. Each pre-amplifier A2 at least includes: a load transistor Q; a switch SW2 for selectively diode-connecting the load transistor Q; and a capacitor C for keeping a voltage of the load transistor Q when the load transistor Q is diode-connected.

In this second pre-amplifier array 14, the respective pre-amplifiers A2 are classified into two systems of an even-numbered system and an odd-numbered system. Then, each amplifier in the even-numbered system receives the respective output voltages of the two amplifiers A1 adjacent to each other in the first preamplifier array 13 as two inputs. An interpolation process and amplification are carried out onto the portion between the two output voltages, so as to output it. Each amplifier in the odd-numbered system amplifies and outputs the output signal of each amplifier A1 of the first pre-amplifier array 13 in its original state.

The latch circuit array 15 is configured such that latch-circuits whose number corresponds to the resolution capability are arranged, and it latches output voltages from the respective pre-amplifiers in the second pre-amplifier array 14. By the way, although illustrations are omitted because they have no direct relation to the characteristic feature of the present invention, a comparator circuit array in which comparators for sequentially comparing the output voltages from the-respective-pre-amplifiers in-the second pre-amplifier array 14 through the latch-circuit array 15 are arranged and a logic processor circuit for logically processing the respective comparison outputs from this comparator array interpose between the latching circuit array 15 and the encoding circuit 16. Then, the encoder 16 encodes the result of the logical processing in the logic processor circuit, and digitally converts it and then obtains a digital signal.

Figure 2:
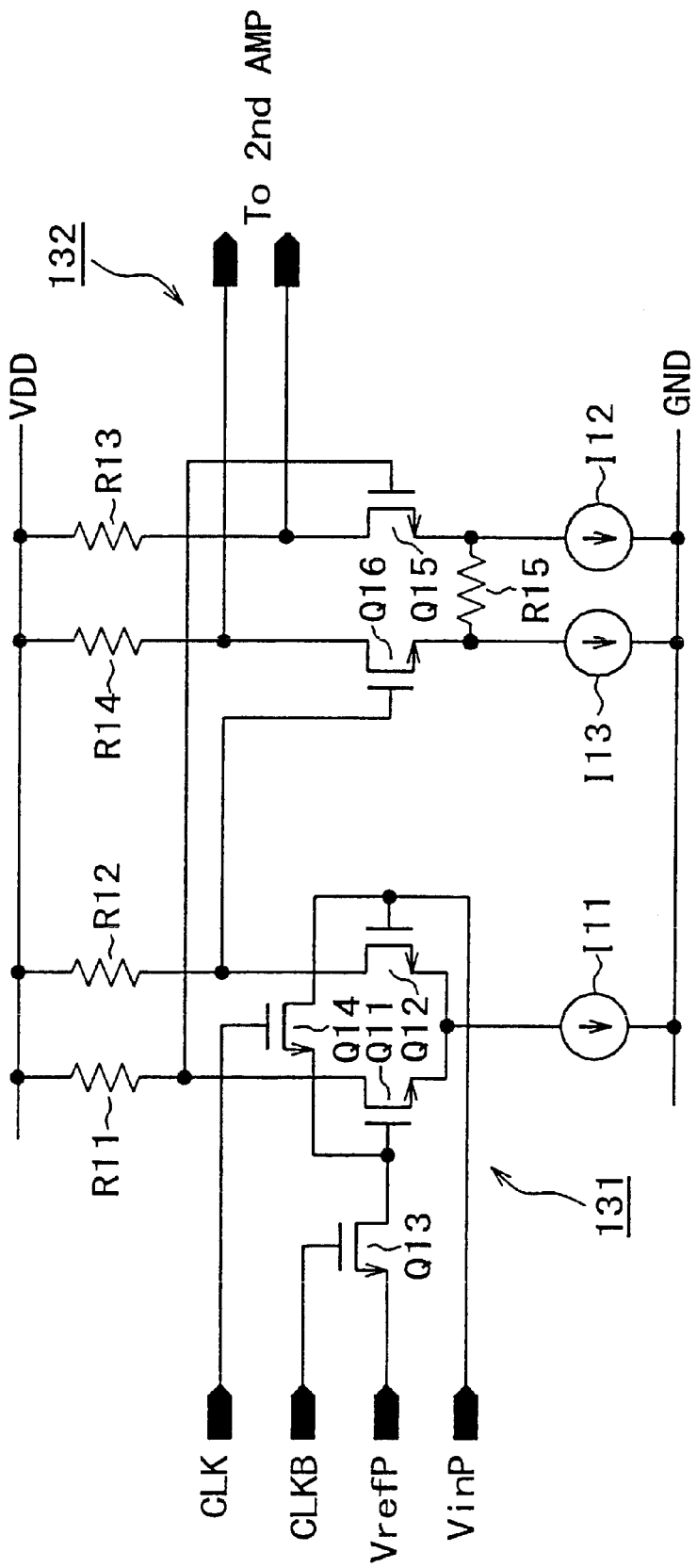
FIG. 2 is a circuit diagram showing an example of a circuit configuration of a first pre-amplifier.

FIG. 2 is a circuit diagram showing an example of the circuit configuration of the first pre-amplifier array 13 (hereafter, it may be referred to as a first pre-amplifier 13 representing one of them).

This first pre-amplifier 13 has the two-stage configuration composed of a differential amplifier 131 at a first stage and an output amplifier 132 at a second stage. The differential amplifier 131 is provided with: a pair of MOS transistors Q11, Q12 whose sources are commonly connected for carrying out a differential operation; load resistors R11, R12, each connected between each drain of the MOS transistors Q11, Q12 and a power supply VDD; and a current source I11 connected between a ground GND and a source common connection point between the MOS transistors Q11, Q12.

In the differential amplifier 131 having the above-mentioned configuration, a reference voltage VrefP is sent through an input switch, for example, a MOS transistor Q13, to one of the differential input ends, namely, a gate of the MOS transistor Q11. This reference voltage VrefP is the reference voltage obtained at each connection node of the reference voltage generating circuit 12. A comparison input voltage VinP is sent to the other end of the differential input end, namely, a gate of the MOS transistor Q12. This comparison input voltage VinP is the hold voltage of the sample/hold circuit 11.

A reset switch, for example, a MOS transistor Q14, is connected between the differential input ends of this differential amplifier 131, namely, between the respective gates of the MOS transistors Q11, Q12. A control clock CLK is applied to a gate of this MOS transistor Q14. By the way, a control clock CLKB whose phase is opposite to that of the control clock CLK is applied to the above-mentioned gate of the MOS transistor Q13.

The output amplifier 132 is provided with: a pair of MOS transistors Q15, Q16, each using each differential output from the differential amplifier 131 as a differential input; load resistors R13, R14, each connected between each drain of the MOS transistors Q15, Q16 and the power supply VDD; a source resistor R15 connected between respective sources of the MOS transistors Q15, Q16; and current sources I12, I13, each connected between end source of the MOS transistors Q15, Q16 and the ground GND.

In this output amplifier 132, the resistance generation reduces an effective gm (a mutual conductance), to thereby expand an input range. Also, a gain limitation to limit a signal amplitude is carried out by selecting a bias current through the load resistors R13, R14, and th source resistor R15 in order to reduce an output voltage generated when the differential pair-at the first stage (the MOS transistors Q11, Q12) are perfectly strobed. That is, the first pre-amplifier 13 has the function of limiting the signal amplitude so that each pre-amplifier in the second pre-amplifier array 14 at the later stage is not saturated at a time of high amplitude input.

Figure 3:
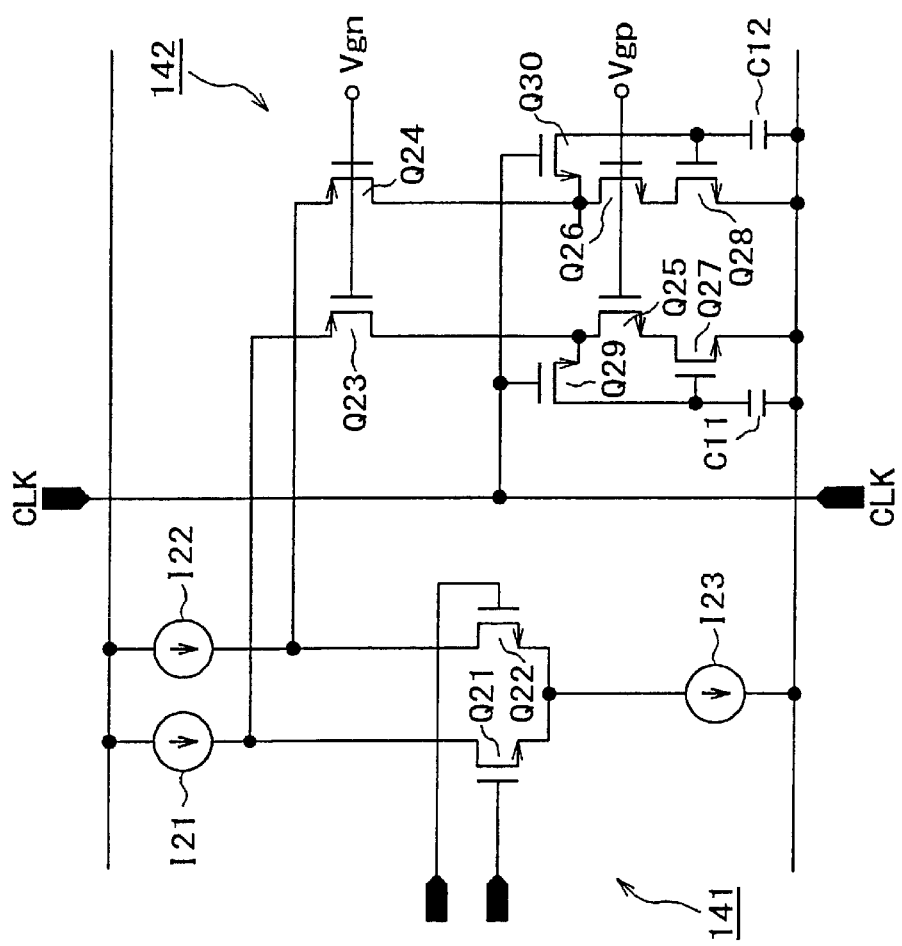
FIG. 3 is a circuit diagram showing an example of a circuit configuration of a second pre-amplifier.

FIG. 3 is a circuit diagram showing an example of the circuit configuration of the second pre-amplifier array 14 (hereafter, it may be referred to as a second pre-amplifier 14 representing one of them).

This second pre-amplifier 14 is provided with a differential circuit 141 and a load circuit 142. The differential circuit 141 is composed of: MOS transistors Q21, Q22 whose sources are commonly connected for carrying out a differential operation; current sources I21, I22, each connected between each drain of the MOS transistors Q21, Q22 and the power supply VDD; and a current source I23 connected between the ground GND and a source-common-connection point between the MOS transistors Q21, Q22. In this differential circuit 141, the differential outputs from the first pre-amplifier array 13, namely, each drain output from the MOS transistors Q15, Q16, are sent to each of the gates of the MOS transistors Q21, Q22.

The load circuit 142 is provided with: MOS transistors Q23, Q25 and Q27 cascode-connected between the ground GND and one output end (the drain of the MOS transistor Q21) of the differential circuit 141; MOS transistors Q24, Q26 and Q28 cascode-connected between the ground GND and the other output end (the drain of the MOS transistor Q22); capacitors C11, C12, each connected between the ground GND and each gate of the MOS transistors Q27, Q28; and switching units, for example, MOS transistors Q29, Q30, each connected between each drain of the MOS transistors Q25, Q26 and each gate of the MOS transistors Q27, Q28.

In this load circuit 142, a predetermined bias voltage Vgn is applied to the respective gates of the MOS transistors Q23, Q24. Similarly, a predetermined bias voltage Vgp is applied to the respective gates of the MOS transistors Q25, Q26. Then, the MOS transistors Q29, Q30 switch between a diode load and a cascode load, which will be described later, on the basis of the polarity of the control clock CLK sent to each gate. The capacitors C11, C12 keep voltages at a time of diode load. This voltage corresponds to the voltage in which the offset of the respective amplifiers in the first pre-amplifier array 13 is multiplied by a gain of the second pre-amplifier at the time of the diode load. Then, the respective drain outputs of the MOS transistors Q23, Q24 are sent to the latching circuit array 15 at the next stage.

As can be understood from the above-mentioned explanation, the second pre-amplifier 14 provided with the differential circuit 141 having the above-mentioned configuration and the load circuit 142 having the above-mentioned configuration has the folded cascode amplifier configuration. However, this configuration is only one example. If the second pre-amplifier 14 at least includes: the MOS transistors Q27, Q28 serving as the load transistor; the MOS transistors Q29, Q30 which use them as the diode load (the diode connection) at the time of the reset mode; and the capacitors C11, 12 for keeping the voltages at the time of the diode load, it is possible to attain the original subject of the offset suppression which will be described later.

Figure 4:
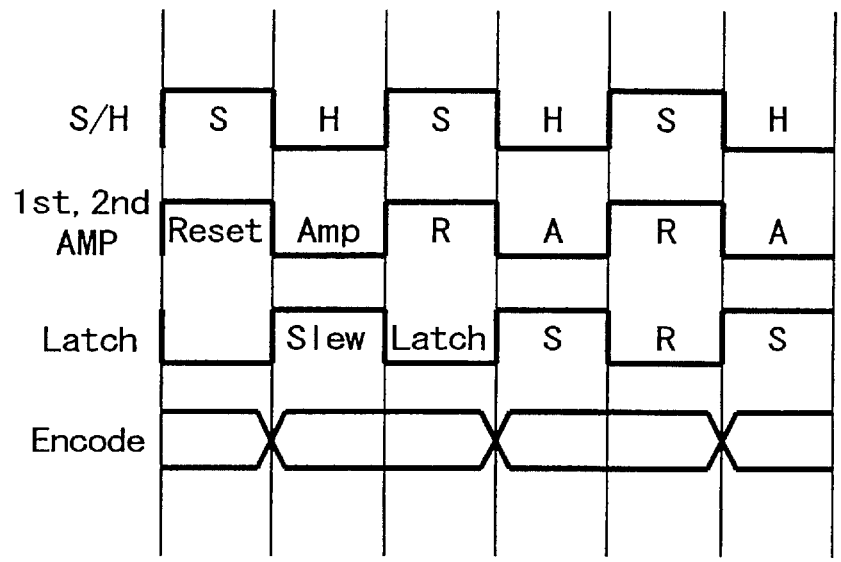
FIG. 4 is a timing chart used to explain a circuit operation of a parallel interpolation AD converter according to this embodiment.

The circuit operation of the parallel interpolation AD converter having the above-mentioned configuration according to this embodiment will be described below with reference to the timing chart of FIG. 4. By the way, this parallel interpolation AD converter carries out the circuit operation for the AD conversion by repeating two modes of a reset mode and an amplification mode.

At first, during a sampling period (a period indicated by S of FIG. 4) in which the sample/hold circuit 11 at the input stage samples the input analog signal, the first pre-amplifier 13 and the seond pre-amplifier 14 are both at the reset state. At this reset mode, the control clock CLK is at a high level. Thus, the portion between the comparison input end of the first pre-amplifier array 13 and the reference input end, namely, the portion between the respective gates-of the MOS transistors Q11, Q12 of the differential amplifier 131 is short circuited by the MOS transistor Q14. At this time, since the reversed-phase control clock CLKB is at a low level, the MOS transistor Q13 becomes an off-state.

When the circuit operation enters into a holding period (a period indicated by H of FIG. 4) in which the sample/hold circuit 11 holds the sampled value, the polarities of the control clocks CLK, CLKB are inverted. Thus, the MOS transistor Q14 is turned off, and the MOS transistor Q13 is turned on. Then, the reference voltage VrefP is inputted to the input end on the reference voltage side of the first pre-amplifier 13, namely, the gate of the MOS transistor Q12 of the differential amplifier 131. Consequently, the circuit operation enters into the amplification mode, and the amplifying operation is started.

Then, in the second pre-amplifier array 14, the respective amplifiers in the even-numbered system interpolate the portions between the respective output voltages from the two amplifiers adjacent to each other in the first pre amplifier array 13 and amplify and output them. On the other hand, the respective amplifiers in the odd-numbered system amplify and output the output voltages from the respective amplifiers in the first pre-amplifier array 13 in their original states. The results of the outputs from the respective amplifiers in this second pre-amplifier array 14 are received by the latch circuit array 15. Then, an AD-conversion operation similar to the case of the above-mentioned basic parallel AD converter is performed on them, which converts them into digital data by the encoding circuit 16.

Here, the first pre-amplifier 13 does not have an offset canceling function, because of the amplifier configuration of the non-chopper type. So, the parallel interpolation AD converter according to this embodiment is intended to improve the offset resistance property by providing an offset compression function to the second pre-amplifier 14. This offset compression function of the second pre-amplifier 14 will be described below.

Figure 5:
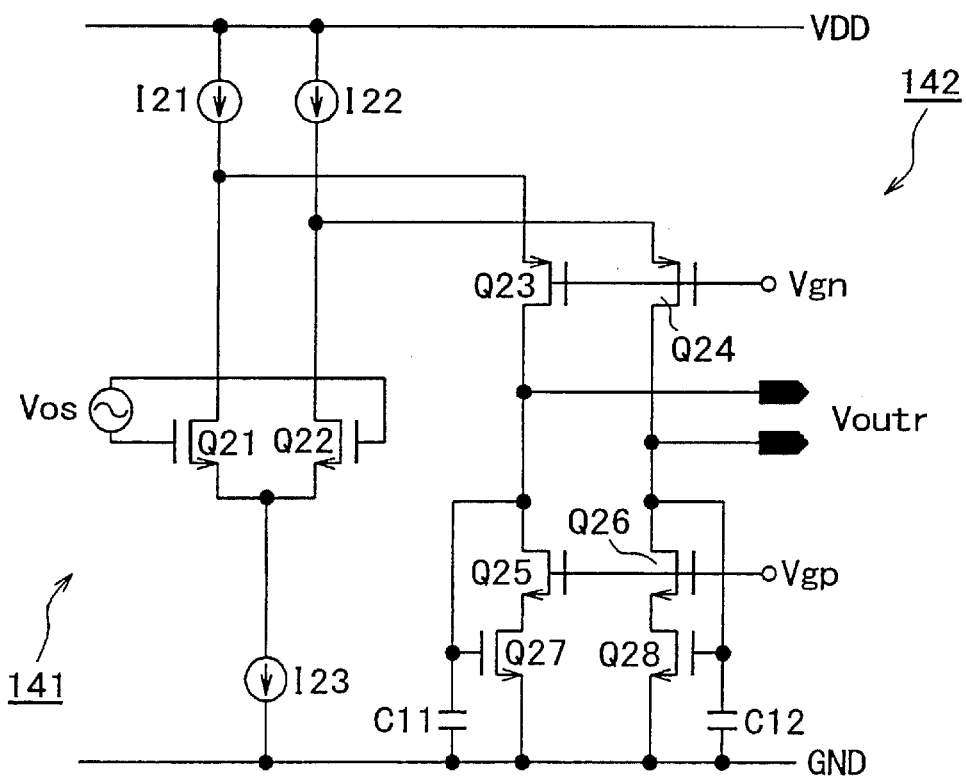
FIG. 5 is an equivalent circuit diagram at a time of a reset mode of a second pre-amplifier.

In the circuit configuration example of FIG. 3, the offset is reduced by employing a compressing method of using a gain difference between the reset mode and the amplification mode. Specifically, at first, at the time of the reset mode, the MOS transistors Q29, Q30 are both turned on by the control clock CLK. Consequently, as can be seen from the equivalent circuit of FIG. 5, the gates and the drains of the MOS transistors Q27, Q28 are short-circuited, and the MOS transistors Q27, Q28 become the state of the diode-connection, and the load circuit 142 becomes the diode load. Thus, the gain becomes relatively low.

When the gain at the time of this reset mode is set to be Gr and there is an offset of Vos (corresponding to an offset of thee first pre-amplifier array) in the differential pair (the MOS transistors Q21, Q22) of the second pre-amplifier 14, an output voltage Voutr is given by the following equation.

$Voutr=Vos*Gr$

Figure 6:
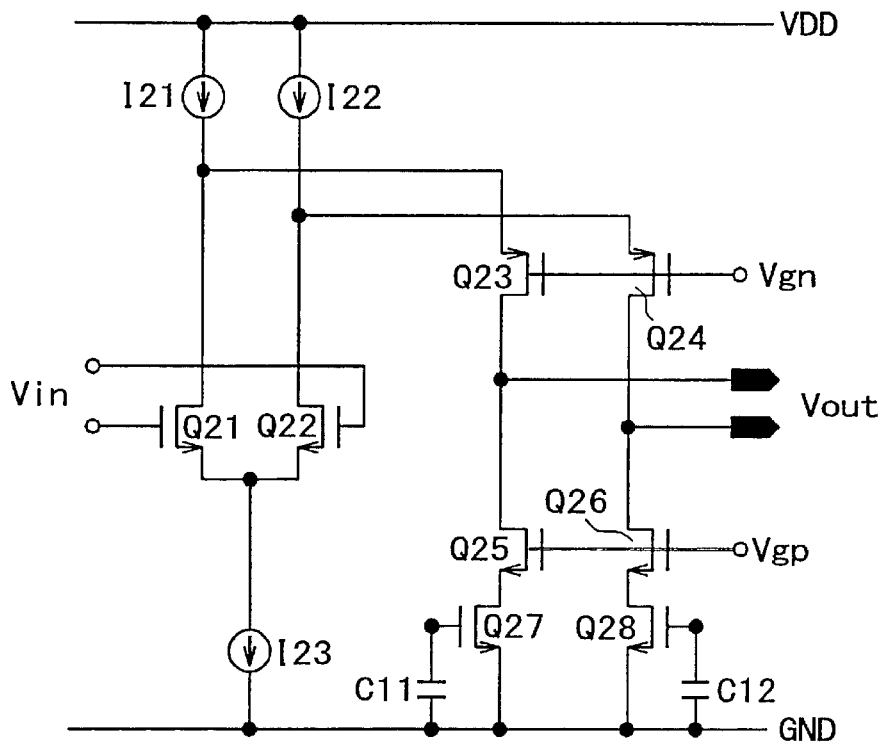
FIG. 6 is an equivalent circuit diagram at, a time of an amplification mode of a second pre-amplifier.

Next, at the time of the amplification mode, the MOS transistors Q29, Q30 are both turned off by the control clock CLK. Consequently, as can be seen from the equivalent circuit of FIG. 6, the MOS transistors Q23, Q25 and Q27 and the MOS transistors Q24, Q26 and Q28 are respectively cascode-connected. Thus, the load circuit 142 becomes the cascode load. Hence, the gain is greatly increased.

Here, the capacitors C11, C12 keep the voltage Voutr at the time of the reset mode, namely, at the time of the diode load. Thus, an operational point as DC is not changed. When this gain at the time of the amplification mode is assumed to be Ga and an input conversion offset Veq is calculated, it is given by the following equation.

$Veq=Vos*Gr/Ga$

Thus, the effect of the offset compression can be increased by setting the gain difference between the gain Gr at the time of the reset mode and the gain Ga at the time of the amplification mode larger. Then, the switching between the gains enables the offset Vos to be equivalently canceled. That is, even if the first pre-amplifier 13 does not have the offset canceling function, the offset Vos caused by the variation in the properties of the transistors constituting the first pre-amplifier 13 and the like can be suppressed by the offset compression effect of the second pre-amplifier 14. Thus, it is possible to improve the offset resistance property.

By the way, input of an analog signal having a high amplitude causes the first pre-amplifier 13 and the second pre-amplifier 14 to be excessively saturated. Thus, there may be the fear that the response in the shift to the reset mode from the amplification mode becomes slow. In particular, in the second pre-amplifier 14, the load is diode-connected, and the capacitors C11, C12 for keeping the offset voltage seem to serve as the load. Hence, the response to return back to the reset state becomes critical, which limits the high-speed conversion operation.

In view of the above-mentioned circumstances, in the parallel interpolation AD converter according to this embodiment, the first pre-amplifier 13 has the gain limiting function, as mentioned above. This gain limiting function enables the signal amplitude to be limited in the first pre-amplifier 13, even at the time of high amplitude input. Thus, it is possible to prevent the second pre-amplifier 14 from being saturated.

Figure 7:
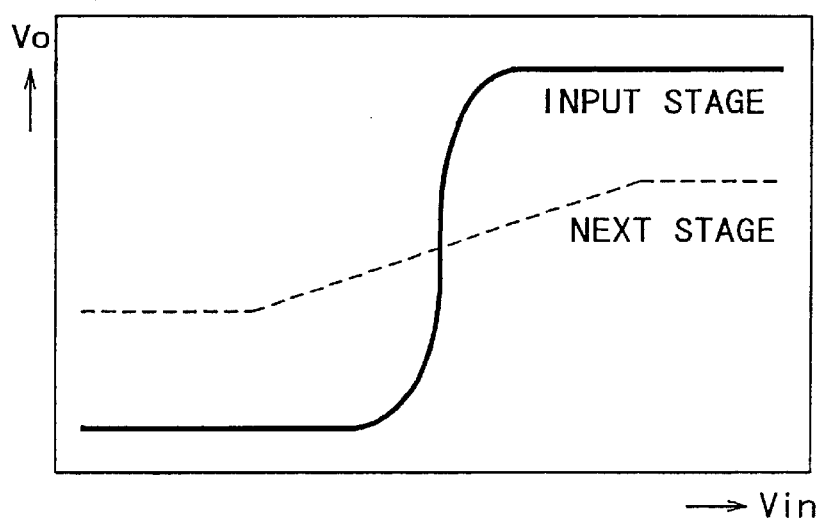
FIG. 7 is an input-output property view at an input stage and a next stage of a first pre-amplifier 13.
Figure 8:
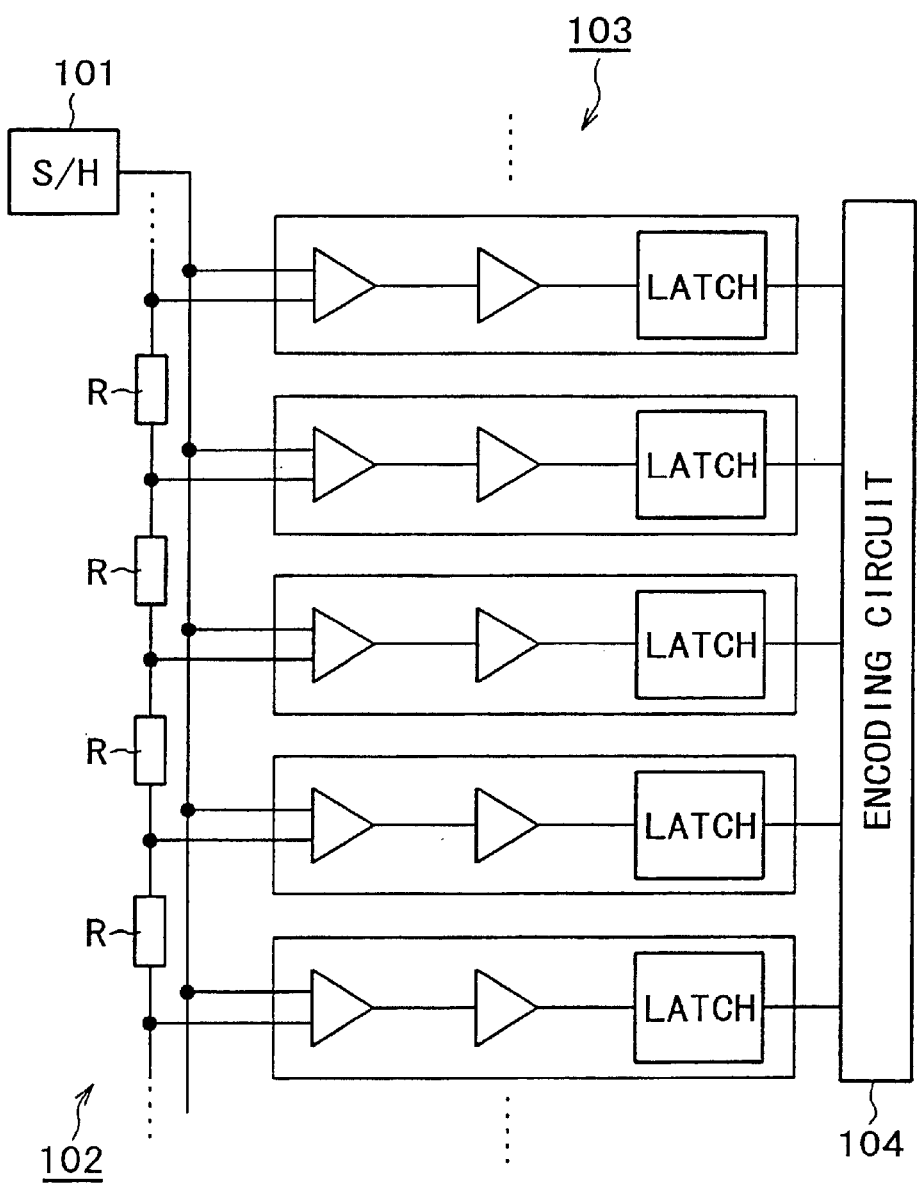
FIG. 8 is a block diagram showing a basic configuration of a parallel AD converter.
Figure 9:
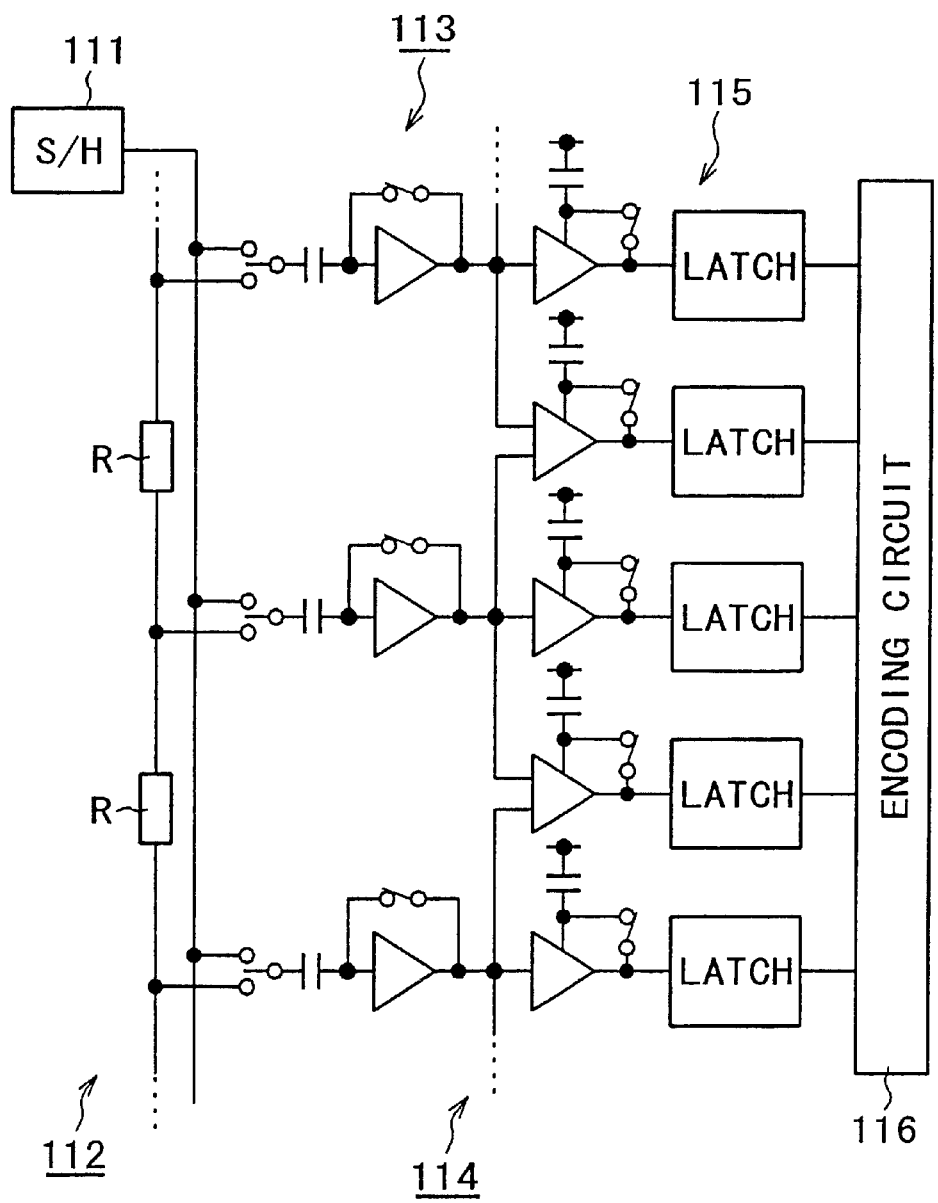
FIG. 9 is a block diagram showing a configuration of a parallel interpolation AD converter according to a conventional example.

FIG. 7 shows an image indicative of the input-output properties of the differential amplifier 131 at the input stage (the first stage) in the first pre-amplifier 13 and the output amplifier 132 at the next stage (the second stage). In this input-output property graph, the solid line indicates the property at the input stage, and its the dashed line indicates the property at the second stage, respectively. As can be seen from this input-output property graph, the output linear, range of the output amplifier 132 at the next stage is narrower than an output linear range of the differential amplifier 131 at the input stage. On the basis of the input-output properties, the process is carried out for sufficiently amplifying the signal having a low amplitude and limiting the amplitude of the signal having a high amplitude.

As mentioned above, the usage of the interpolation technique protects the increase in circuit size. Moreover, in the parallel interpolation AD converter capable of high-speed operation at low electric power consumption, employment of the configuration in which the comparison input end of the first pre-amplifier 13 is directly connected to the output end of the sample holding circuit 11 results in that, as compared with the conventional technique in which the chopper-type amplifier is used in the first pre-amplifier, the capacitor does not interpose between the first pre-amplifier 13 and the sample/hold circuit 11. Hence, it is possible to largely reduce the load on the sample/hold circuit 11.

Consequently, the circuit configuration having low driving performance can be used for the output stage of the sample/hold circuit 11. Thus, it is possible to reduce the electric power consumption of the sample/hold circuit 11 and even the electric power consumption of the entire parallel interpolation AD converter according to this embodiment. Moreover, since the load becomes lighter, the sample/hold circuit 11 having excellent linearity can be easily designed, which is very convenient.

Also, the parallel interpolation AD converter according to this embodiment loses the offset canceling function, because the first pre-amplifier 13 is not a chopper type. However, because the second pre-amplifier 14 has the offset compressing function, it is possible to attain high-speed circuit operation at low electric power consumption without losing offset resistance performance.

By the way, although the above-mentioned embodiment has been explained on an assumption that the sample/hold circuit 11 is installed at the former stage of the first pre-amplifier 13, the sample/hold circuit 11 is not the inevitable member. However, by applying the present invention to the parallel interpolation AD converter employing the configuration in which it includes the sample/hold circuit 11, and the sample/hold circuit 11 is especially integrated on the same substrate (chip) as the reference voltage generating circuit 12, the first pre-amplifier array 13, the second pre-amplifier array 14, the latch circuit array 15 and the encoding circuit 16, the circuit configuration having low driving performance can be used at the output stage of the sample/hold circuit 11. Thus, this has the merit that the electric power consumption in the sample/hold circuit 11 can be reduced.

As mentioned above, according to the present invention, the sample capacity for the chopper is unnecessary. Thus, the load on the circuit at the former stage (for example, the sample/hold circuit) can be largely reduced to thereby surely reduce the electric power consumption and further attain the parallel AD converter which enables faster circuit operation.

What is claimed is:

1. A parallel AD converter, comprising:
    a reference voltage generator for generating a plurality of reference voltages;
    a first amplifier array constituted by arranging first differential amplifiers, in which an analog signal is inputted to a comparison input end of each of said first differential amplifiers, and a corresponding reference voltage among said plurality of reference voltages generated by said reference voltage generator is inputted to a reference input end of each of said first differential amplifiers, respectively, and each first differential amplifier has a reset switch that is controlled so as to be opened or closed by a predetermined control clock between both input ends and amplifies a potential difference between both input ends; and
    a second amplifier array in which interpolation amplifiers, each of which interpolates and amplifies a portion between output voltages from the first differential amplifiers adjacent to each other in said first amplifier array, and second differential amplifiers, each of which amplifies the output voltage from every other first differential amplifier in said first amplifier array, are alternately arranged,
    wherein each of the interpolation amplifiers and the second differential amplifiers in said second amplifier array includes: an active element in a load; and a switching unit for selectively constituting first and second load elements by switching said active element in synchronization with said control clock.

2. The parallel AD converter according to claim 1, wherein said first load element is a transistor and said second load element is a diode.

3. The parallel AD converter according to claim 2, further comprising a capacitor for keeping a voltage of said diode when said load element is the diode.

4. The parallel AD converter according to claim 2, wherein the transistor of said load element comprises a cascode connected transistor, and
    said switching unit switches the transistor of said load element between a diode load and a cascode load in synchronization with said control clock.

5. The parallel AD converter according to claim 1, wherein said interpolation amplifier and said second differential amplifier in said second amplifier array are constituted by a folded cascode amplifier.

6. The parallel AD converter according to claim 1, wherein said first differential amplifier has a two-stage amplifying stage, and an output linear range of an amplifying stage at a second stage is narrower than an output linear range of an amplifying stage at a first stage.

7. The parallel AD converter according to claim 2, further comprising a sample/hold circuit for sampling said analog signal, holding it for a certain period, and then sending its hold voltage to a comparison input end of said first differential amplifier,
    wherein said switching unit diode-connects said load element during a sampling period of said sample/hold circuit.

8. The parallel AD converter according to claim 7, wherein said sample/hold circuit is integrated on a same substrate together with said reference voltage generator, said first amplifier array and said second amplifier array.

9. A parallel-type AD converter, comprising:
    a reference voltage generator for generating a plurality of reference voltages;
    a first amplifier array constituted by arranging first differential amplifiers, in which an analog signal is inputted to a comparison input end of each of said first differential amplifiers, a corresponding reference voltage among said plurality of reference voltages generated by said reference voltage generator is inputted to a reference input end of each of said first differential amplifiers, respectively, and each first differential amplifier has a reset switch that is controlled so as to be opened or closed by a predetermined control clock between both input ends and amplifies a potential difference between both input ends; and
    a second amplifier array in which complementary amplifiers, each of which interpolates and amplifies a portion between output voltages from the first differential amplifiers adjacent to each other in said first amplifier array, and second differential amplifiers, each of which amplifies the output voltage from every other first differential amplifier in said first amplifier array, are alternately arranged,
    wherein each of the interpolation amplifiers and the second differential amplifiers in said second amplifier array includes: a load transistor; a switching unit for selectively diode-connecting said load transistor in synchronization with said control clock; and a capacitor for keeping a voltage of said load transistor when said load-transistor is diode-connected.

10. The parallel AD converter according to claim 9, wherein said load transistor comprises cascode connected transistors, and said switching unit switches said load transistor between a diode load and a cascode load in synchronization with said control clock.

11. The parallel AD converter according to claim 9, wherein said interpolation amplifier and said second differential amplifier in said second amplifier array are constituted by a folded cascode amplifier.

12. The parallel AD converter according to claim 9, wherein said first differential amplifier has a two-stage amplifying stage, and an output linear range of an amplifying stage at a second stage is narrower than an output linear range of an amplifying stage at a first stage.

13. The parallel AD converter according to claim 10, further comprising a sample/hold circuit for sampling said analog signal, holding it for a certain period, and then sending its hold voltage to a comparison input end of said first differential amplifier, wherein said switching unit diode-connects said load transistor during a sampling period of said sample/hold circuit.

14. The parallel AD converter according to claim 13, wherein said sample/hold circuit is integrated on a same substrate together with said reference voltage generator, said first amplifier array and said second amplifier array.

* * * * *